United States Patent
Song

(10) Patent No.: US 10,747,456 B2
(45) Date of Patent: Aug. 18, 2020

(54) MEMORY CONTROLLER, MEMORY MODULE, AND MEMORY SYSTEM AND OPERATION METHODS THEREOF

(71) Applicant: SK hynix Inc., Icheon-si, Gyeonggi-do (KR)

(72) Inventor: Young-Ook Song, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 88 days.

(21) Appl. No.: 15/666,076

(22) Filed: Aug. 1, 2017

(65) Prior Publication Data

US 2018/0129418 A1 May 10, 2018

(30) Foreign Application Priority Data

Nov. 9, 2016 (KR) .................. 10-2016-0148780

(51) Int. Cl.
| | |
|---|---|
| G06F 11/00 | (2006.01) |
| G06F 3/06 | (2006.01) |
| G06F 11/10 | (2006.01) |
| G11C 29/52 | (2006.01) |
| G11C 29/04 | (2006.01) |

(52) U.S. Cl.
CPC ............ G06F 3/064 (2013.01); G06F 3/0604 (2013.01); G06F 3/0673 (2013.01); G06F 11/1048 (2013.01); G06F 11/1068 (2013.01); G11C 29/52 (2013.01); *G11C 2029/0411* (2013.01)

(58) Field of Classification Search
CPC .. G06F 2201/00; G06F 11/14; G06F 11/1048; G06F 3/0604; G06F 3/064; G06F 3/0673; G06F 11/1068; G11C 29/52; G11C 2029/0411

USPC ...................................... 714/763, 764, 766
See application file for complete search history.

(56) References Cited

U.S. PATENT DOCUMENTS

| | | | |
|---|---|---|---|
| 7,877,668 B2* | 1/2011 | Sugahara ............ | G06F 11/1068 365/148 |
| 8,261,159 B1 | 9/2012 | Sommer et al. | |
| 8,713,404 B2* | 4/2014 | Fai ....................... | G06F 11/1004 324/314 |
| 8,898,541 B2* | 11/2014 | Okubo ................ | G06F 11/1048 714/755 |
| 2009/0044076 A1* | 2/2009 | Sugahara ............ | G06F 11/1068 714/764 |
| 2011/0032758 A1* | 2/2011 | Son ..................... | G06F 11/1072 365/185.03 |
| 2011/0283166 A1* | 11/2011 | Kim ..................... | G06F 11/106 714/773 |
| 2012/0102380 A1* | 4/2012 | Ishikawa ............. | G06F 11/1072 714/763 |

(Continued)

*Primary Examiner* — Albert Decady
*Assistant Examiner* — Osman M Alshack
(74) *Attorney, Agent, or Firm* — William Park & Associates Ltd.

(57) ABSTRACT

A memory controller may be provided. A memory module may be provided. A memory system may be provided. A method of operating the memory system, the memory controller, or memory module may be provided. The memory system may include a memory controller and a memory module. The memory controller may provide data to the memory module to store data within the memory module. The memory controller may generate an index for storing the data. The index may be stored within the memory module.

4 Claims, 4 Drawing Sheets

(56) References Cited

U.S. PATENT DOCUMENTS

| | | | | |
|---|---|---|---|---|
| 2012/0297271 A1* | 11/2012 | Sommer | ............ | G06F 11/1048 |
| | | | | 714/766 |
| 2014/0086411 A1* | 3/2014 | Nagai | ................... | H04L 9/0816 |
| | | | | 380/255 |
| 2014/0281816 A1* | 9/2014 | Schwartz | ............ | G06F 17/2217 |
| | | | | 714/768 |
| 2015/0261797 A1* | 9/2015 | Alcantara | ............. | G06F 16/217 |
| | | | | 707/813 |
| 2017/0077958 A1* | 3/2017 | Torii | ................. | H03M 13/2909 |
| 2017/0147259 A1* | 5/2017 | Lee | ....................... | G06F 3/0604 |

* cited by examiner

MEMORY CONTROLLER, MEMORY MODULE, AND MEMORY SYSTEM AND OPERATION METHODS THEREOF

CROSS-REFERENCE TO RELATED APPLICATIONS

The present application claims priority of Korean Patent Application No. 10-2016-0148780, filed on Nov. 9, 2016, which is incorporated herein by reference in its entirety.

BACKGROUND

1. Technical Field

Embodiments of the present disclosure may generally relate to a memory controller, memory module, and memory system, and more particularly, to a memory controller, memory module, and memory system and operating methods thereof.

2. Related Art

Earlier is the history of manufacturing semiconductor memory a greater number of original good dies having no defective memory cells in the manufactured memory chips distributed throughout the wafer was possible. However, now as the capacities of memory devices increase it becomes more and more difficult to manufacture a memory device without any defective memory cells.

One way to overcome these issues is to perform a method of repairing the defective memory cell with redundancy memory cells.

Another way to address these issues, for a memory system, is to implement an error correction code (ECC) circuit for correcting an error in a memory cell and errors occurring in data transfer during read and write operations.

SUMMARY

In accordance with an embodiment of the present disclosure, a memory controller and or a method of operating the memory controller may be provided. In accordance with an embodiment of the present disclosure, a memory module and or a method of operating the memory module may be provided. In accordance with an embodiment of the present disclosure, a memory system and or method of operating the memory system may be provided. The memory system may include a memory controller and a memory module. The memory controller may provide data to the memory module to store data within the memory module. The memory controller may generate an index for storing the data. The index may be stored within the memory module.

In accordance with an embodiment of the present disclosure, a memory system may include an index generating circuit configured for generating an index indicating that a host data corresponds to a predetermined pattern from a plurality of predetermined patterns, a data modification circuit configured for modifying the host data into a modified data based on the index, and one or more memory devices configured for storing the modified data and the index.

In accordance with an embodiment of the present disclosure, a memory system may include a data inversion circuit configured for dividing a host data into one or more groups, generating a modified data by inverting or non-inverting the respective groups according to data patterns of the respective groups, and generating an index indicating the inversion or non-inversion of the respective groups, an error correction circuit configured for generating an error correction code (ECC) for the modified data and the index to generate an ECC-encoded data and an ECC-encoded index, and one or more memory devices configured for storing the ECC-encoded data, the ECC-encoded index, and the error correction code.

In accordance with an embodiment of the present disclosure, a memory system may include a plurality of data scramblers configured for generating a plurality of scrambled data by scrambling host data in different ways, respectively, a scramble selection circuit configured for selecting one of the scrambled data as a modified data, and generating an index indicating one of the data scramblers corresponding to the selected scrambled data, and one or more memory devices configured for storing the modified data and the index.

In accordance with an embodiment of the present disclosure, a memory system may include an index generating circuit configured to receive host data including a plurality of data patterns, and generate an index including binary values, each binary value of the index corresponding to a respective predetermined bit pattern included in a data pattern from the plurality of data patterns of the host data; a data modification circuit configured for modifying the host data into modified data based on the index; and at least one memory device configured for storing the modified data and the index.

In accordance with an embodiment of the present disclosure, a method for operating a memory system, the method may include generating, with an index generating circuit, an index indicating that a host data corresponds to a predetermined pattern from a plurality of predetermined patterns, modifying, with a data modification circuit, the host data into a modified data based on the index, and storing the modified data and the index in at least one memory device.

In accordance with an embodiment of the present disclosure, a method for operating a memory system, the method may include dividing, with a data inversion circuit, a host data into one or more groups, generating a modified data by inverting or non-inverting the respective groups according to data patterns of the respective groups, and generating an index indicating the inversion or non-inversion of the respective groups; generating, with an error correction circuit, an error correction code (ECC) for the modified data and the index to generate an ECC-encoded data and an ECC-encoded index; and storing the ECC-encoded data, the ECC-encoded index, and the error correction code within one or more memory devices.

In accordance with an embodiment of the present disclosure, a method for operating a memory system, the method may include generating, with a plurality of data scramblers, a plurality of scrambled data by scrambling host data in different ways, respectively; selecting, with a scramble selection circuit, one of the scrambled data as a modified data, and generating an index indicating one of the data scramblers corresponding to the selected scrambled data; and storing the modified data and the index within one or more memory devices.

DETAILED DESCRIPTION

Figure 1:
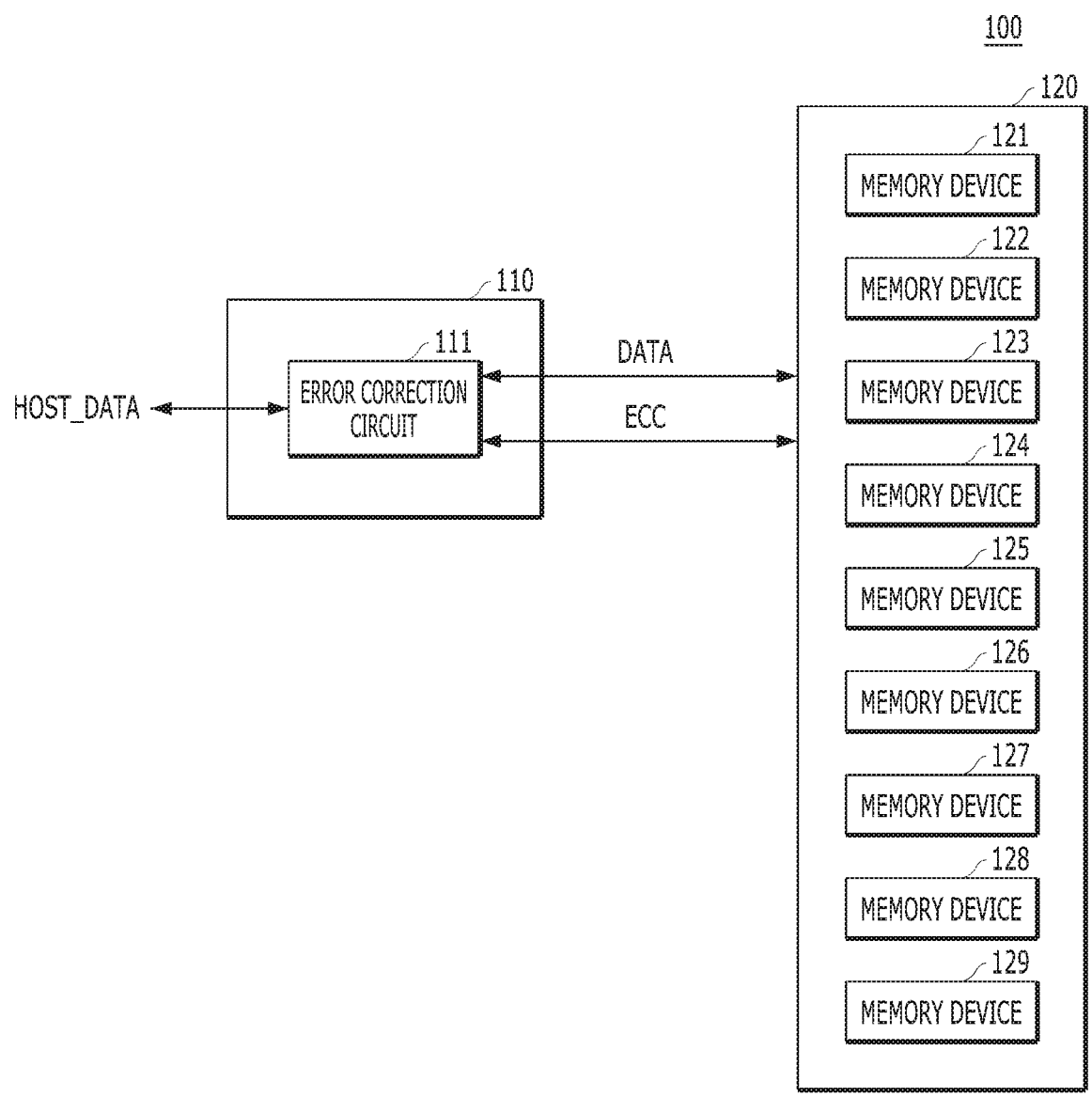
FIG. 1 is a block diagram of a memory system according to first embodiments of the present disclosure.

Various embodiments will be described below with reference to the accompanying drawings. The present embodiments may, however, be embodied in different forms and should not be construed as limited to the embodiments set forth herein. Rather, these embodiments are provided so that this disclosure will be thorough and complete, and will fully convey the scope to those skilled in the art. Throughout the disclosure, like reference numerals refer to like parts throughout the various figures and embodiments of the present disclosure.

Various embodiments may be directed to the enhancement of a memory system's efficiency by using surplus bits remained in a data transfer process and an error correction process of the memory system.

In accordance with various examples of embodiments of the present disclosure, surplus bits remained in a data transfer process and an error correction process of a memory system may be effectively utilized.

FIG. 1 is a block diagram of a memory system 100 according to first embodiments of the present disclosure. FIG. 1 illustrates only a portion directly related to data transfer in the memory system 100.

Referring to FIG. 1, a memory system 100 may include a memory controller 110 and a memory module 120. The memory controller 110 may control operations of the memory module 120 including the read and write operations according to a request from a host. The memory controller 110 may include an error correction circuit 111. The memory module 120 may include at least one memory device 121 to 129. FIG. 1, for example, illustrates the memory module 120 including nine memory devices 121 to 129. The memory devices 121 to 129 may be any one of all kinds of memories including, for example but not limited to, the DRAM, the phase change random access memory (PCRAM) and the flash memory. The memory module 120 may be, for example but not limited to, a dual in-line memory module (DIMM) type.

Data flow in the memory system 100 during the write and read operations will now be described. Here, it is assumed, for example, that a size of host data HOST_DATA or a size of a unit data for the write operation is 512 bits. However, the embodiments are not limited in this manner and more or less bits may be used.

The Write Operation

During the write operation, the error correction circuit 111 of the memory controller 110 may generate an error correction code for the host write data HOST_DATA for detecting and correcting errors in the host write data HOST_DATA. For example, a 64-bit error correction code may be generated for the 512-bit host write data HOST_DATA. A 512-bit write data DATA and the 64-bit error correction code ECC may be transferred to the memory module 120 and written to the memory devices 121 to 129 of the memory module 120. During the write operation, the write data DATA may be the same data as the host write data HOST_DATA. Since the memory module 120 includes nine memory devices 121 to 129 as an example, nine 64-bit portions divided from both of the write data DATA and the error correction code ECC may be stored for the memory devices 121 to 129, respectively. For example, when each of the memory devices 121 to 129 includes eight data pads, the 64-bit portion may be serially arranged into 8-bit streams and then provided to each of the memory devices 121 to 129 and the 64-bit portion of the write data DATA and the error correction code ECC may be stored in each of the memory devices 121 to 129.

The Read Operation

The 512-bit read data DATA and the corresponding 64-bit error correction code ECC may be read from the memory devices 121 to 129 of the memory module 120 during the read operation, and transmitted to the error correction circuit 111 of the memory controller 110. The error correction circuit 111 may correct the error of the read data DATA using the error correction code ECC and may transfer the error-corrected read data to the host as a host read data HOST_DATA. When there is no error in the read data DATA, the read data DATA and the host read data HOST_DATA may be the same data.

The number of bits of the error correction code ECC may be reduced when the probability of errors in the data transfer process in the memory system 100 is not high.

For example, a 32-bit or 48-bit error correction code ECC may be used instead of a 64-bit error correction code ECC in order to correct an error of the 512-bit read data DATA. The number of bits of the error correction code ECC may be variously adjusted according to the error correction capability.

When the number of bits of the error correction code ECC is reduced from a previous or initial error correction code of a greater size, there may be one or more unused extra bits as many as the reduced size. In this case, it is in general that all extra bits are zero-padded. Therefore, a scheme for efficiently utilizing the unused extra bits may be required.

Figure 2:
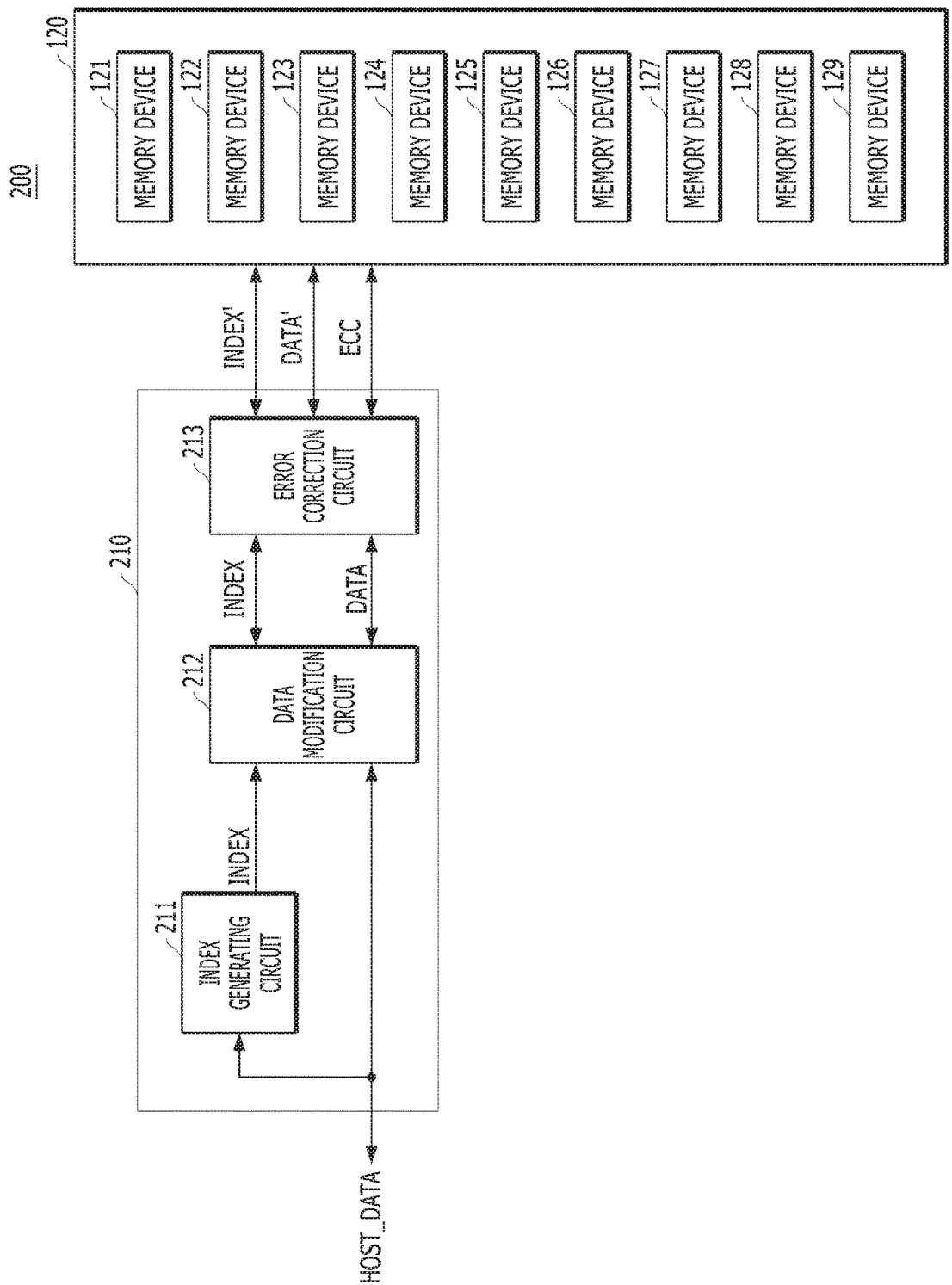
FIG. 2 is a block diagram of a memory system according to second embodiments of the present disclosure.

FIG. 2 is a block diagram of a memory system 200 according to second embodiments of the present disclosure. FIG. 2 illustrates only a portion directly related to data transfer in the memory system 200.

Referring to FIG. 2, the memory system 200 may include a memory controller 210 and a memory module 120. The memory controller 210 may control the read and write operations of the memory module 120 in response to a request from the host.

The memory controller 210 may include an index generating circuit 211, a data modification circuit 212 and an error correction circuit 213. The index generating circuit 211 may generate an index INDEX based on the host write data HOST_DATA. The data modification circuit 212 may perform data modification between the host data HOST_DATA and the data DATA based on the index INDEX. Some of the index generating circuit 211, the data modification circuit 212 and the error correction circuit 213 may be disposed outside the controller 210 according to a system design.

The flow of data in the memory system 200 during the write operation and the read operation will now be described. Here, it is assumed, for example, that a size of data to be written and read during the respective write and read operations is 512 bits. That is, it is assumed that a size of the host data HOST_DATA is 512 bits. However, the embodiments are not limited in this manner and more or less bits may be used.

The Write Operation

During the write operation, the index generation circuit 211 may generate the index INDEX based on the host write data HOST_DATA. The index INDEX may indicate which one of predetermined patterns the hosts write data HOST_DATA corresponds to.

For example, a relationship between the predetermined patterns of the host write data HOST_DATA and the index INDEX may be illustrated in Table 1 below.

TABLE 1

| HOST_DATA | INDEX |
|---|---|
| No corresponding pattern | 000 |
| 00000000 . . . 00000000 | 001 |
| 11111111 . . . 11111111 | 010 |
| 01010101 . . . 01010101 | 011 |
| 10101010 . . . 10101010 | 100 |
| 11110000 . . . 11110000 | 101 |
| 00001111 . . . 00001111 | 110 |

Table 1, for example, illustrates the index INDEX having 3 bits and 6 predetermined data patterns, the size of the index INDEX and the number of the predetermined data patterns may vary according to a system design.

Referring to Table 1, when the host write data HOST_DATA has a pattern of 'all zeros', the index INDEX may have a binary value of '001'. When the host write data HOST_DATA has a repeated pattern of '01', the index INDEX may have a binary value of '011'. When the host write data HOST_DATA corresponds to none of the predetermined patterns, the index INDEX may have a binary value of '000'. However, the embodiments are not limited to what is shown in table 1 or what is discussed with relation to table 1, and in an embodiment, for example, the host data HOST_DATA may have any predetermined data pattern of bits and the respective predetermined data pattern may correspond to any respective binary value of the index INDEX. In an embodiment, for example, an index generating circuit 211 may be configured to receive host data HOST_DATA including a plurality of data patterns, and may generate an index INDEX including binary values, the binary values each corresponding to a respective predetermined bit pattern included in a data pattern from the plurality of data patterns of the host data HOST_DATA.

The data modification circuit 212 may generate the write data DATA based on the index INDEX and the host write data HOST_DATA. When the index INDEX has a binary value of '000', the write data DATA may be the same as the host write data HOST_DATA. When the index INDEX has a value other than '000', the write data DATA may be generated to have a specific value regardless of the value of the host write data HOST_DATA. For example, the write data DATA may have a value of 'all zeros' when the index INDEX indicates that the host write data HOST_DATA corresponds to one of the predetermined patterns. As such, even when the host write data HOST_DATA is modified into the write data DATA having different value, the modification is made on the basis of the index INDEX indicating the specific data pattern (as illustrated in table 1) of the host write data HOST_DATA and thus the host write data HOST_DATA can be restored from the write data DATA based on the index INDEX and table 1.

The size of the write data DATA may be smaller than that of the host write data HOST_DATA. Further, a data pattern of the write data DATA may be simpler than that of the host write data HOST_DATA.

The error correction circuit 213 may generate an error correction code for both of the write data DATA and the index INDEX. The number of bits of the error correction code may be adjusted so that total size of the write data DATA, the index INDEX and the error correction code is smaller than a unit size (e.g., 576 bits) of data to be stored in the memory module 120 at one time.

During the write operation, the write data DATA and the index INDEX input to the error correction circuit 213, and a write data DATA' and an index INDEX', which are ECC-encoded and output from the error correction circuit 213, may be the same as each other, respectively. When the total size of the ECC-encoded write data DATA', the ECC-encoded index INDEX' and the error correction code ECC is smaller than the unit size (e.g., 576 bits) of data to be stored in the memory module 120 at one time, remaining bits in the unit size (e.g., 576 bits) may have a value of zero (0) (i.e., they may be zero-padded).

The ECC-encoded write data DATA', the ECC-encoded index INDEX' and the error correction code ECC may be transmitted to and stored in the memory devices 121 to 129 of the memory module 120.

The Read Operation

During the read operation, the read data DATA', the index INDEX', and the error correction code ECC may be read from the memory devices 121 to 129 of the memory module 120 and transmitted to the error correction circuit 213 of the memory controller 210. The error correction circuit 213 may correct the errors of the read data DATA' and the index INDEX' by using the error correction code ECC, and generate an ECC-decoded read data DATA and an ECC-decoded index INDEX. When there is no error in the read data DATA' and the index INDEX', the read data DATA' and the index INDEX' may be the same as the ECC-decoded read data DATA and the ECC-decoded index INDEX, respectively.

When the ECC-decoded index INDEX has a binary value of '000', the data modification unit 212 may provide the host with the ECC-decoded data DATA as the host read data HOST_DATA since the data DATA corresponding to the index INDEX of '000' is not modified by the data modification unit 212 during the write operation. However, when the ECC-decoded index INDEX has a value other than '000', the host read data HOST_DATA may be restored on the basis of the ECC-decoded index INDEX and table 1 irrespective of the value of the ECC-decoded read data DATA. For example, when the ECC-decoded index INDEX has a binary value of '101', the host read data HOST_DATA may be restored to have a value of '11110000 . . . 11110000', as illustrated in table 1.

The restored host read data HOST_DATA may be transferred from the data modification unit 212 to the host.

In the memory system 200 of FIG. 2, although the index INDEX is further added to the host data HOST_DATA as well as the error correction code, the host data HOST_DATA having a predetermined data pattern may be modified to the data DATA having simpler data pattern through the small-sized index INDEX and table 1 by the data modification circuit 212. Due to the simpler pattern of the modified data DATA than the original host data HOST_DATA, the amount of current required to write and read the data of the simpler pattern may be reduced.

For example, when the memory devices 121 to 129 are the PCRAMs, the current consumption of the write operation and the lifetime of the memory devices 121 to 129 depend on which one of '0' and '1' data is written to the memory devices 121 to 129 and thus it may be more advantageous to store the simpler pattern of the data DATA modified through the index INDEX into the memory devices 121 to 129.

In addition, when the memory devices 121 to 129 are the DRAMs, the current consumption may be reduced during the transmission of the data DATA', which has simpler pattern by the modification through the index INDEX, between the memory devices 121 to 129 and the controller 210.

Figure 3:
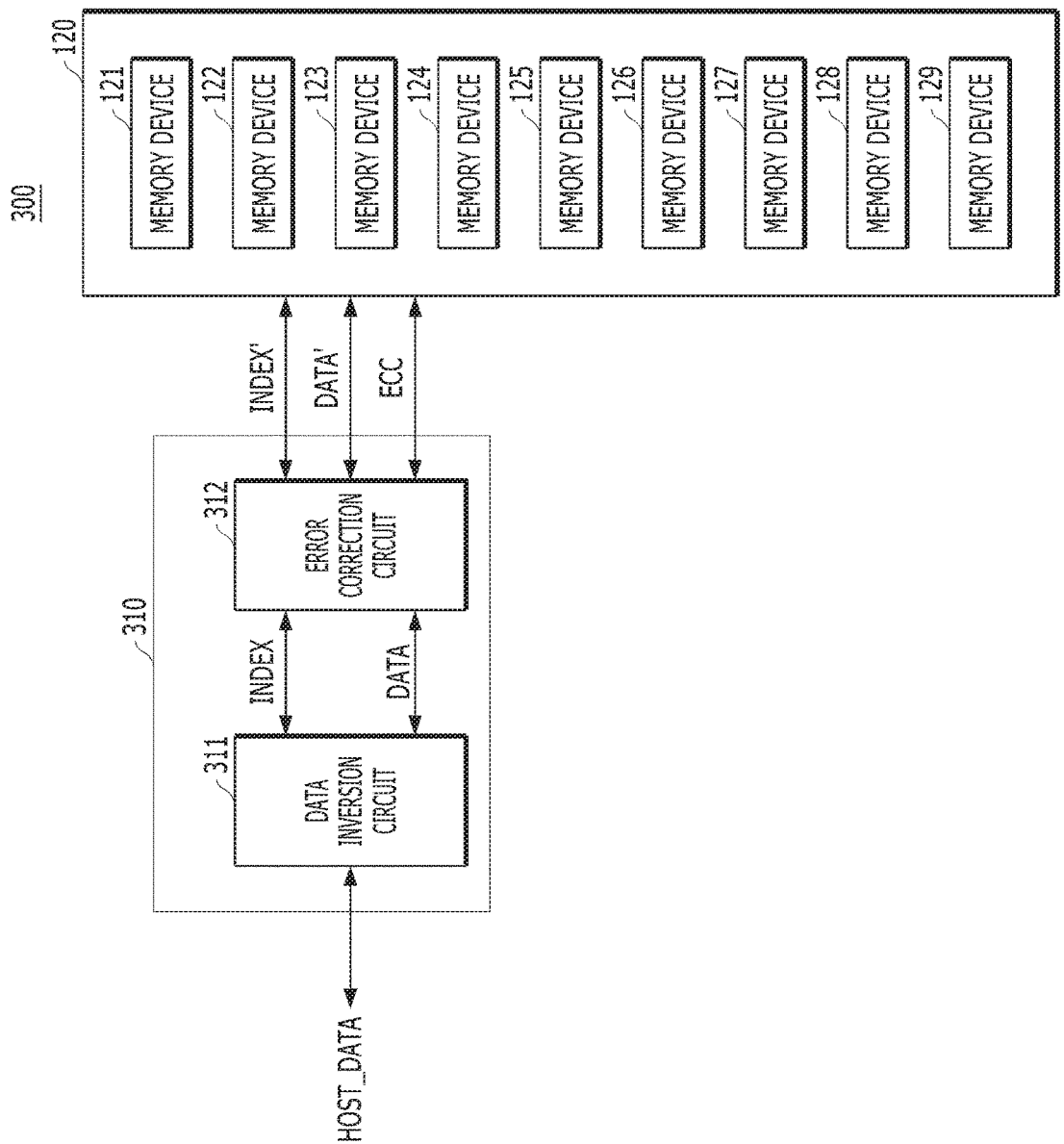
FIG. 3 is a block diagram of a memory system according to third embodiments of the present disclosure.

FIG. 3 is a block diagram of a memory system 300 according to third embodiments of the present disclosure. FIG. 3 illustrates only a portion directly related to data transfer in the memory system 300.

Referring to FIG. 3, the memory system 300 may include a memory controller 310 and a memory module 120. The memory controller 310 may control the read and write operations of the memory module 120 according to a request from the host.

The memory controller 310 may include a data inversion circuit 311 and an error correction circuit 312. The data inversion circuit 311 may generate a write data DATA by inverting or non-inverting the host write data HOST_DATA, and generate an index INDEX indicating whether the host write data HOST_DATA is inverted or non-inverted. Some of the data inversion circuit 311 and the error correction circuit 312 may be disposed outside the controller 310 according to a system design.

The flow of data in the memory system 300 during the write and read operations will now be described. Here, it is assumed that a size of data to be written and read during the respective write and read operations is 512 bits. That is, it is assumed that a size of the host data HOST_DATA is 512 bits. However, the embodiments are not limited in this manner and more or less bits may be used.

The Write Operation

During the write operation, the data inversion circuit 311 may generate the write data DATA by dividing the host write data HOST_DATA into a plurality of groups and inverting or non-inverting the respective groups, and may generate the index INDEX indicating whether the respective groups are inverted or non-inverted. For example, the data inversion circuit 311 may divide the host write data HOST_DATA 512 bits into four 128-bit groups, perform the inversion or non-inversion operation for each of the four groups, and generate index INDEX of 4 bits indicating the inversion or non-inversion of each group. The size of the index INDEX may depend on the number of groups divided from the host write data HOST_DATA. The inversion or non-inversion may be determined depending on whether or not the number of '1's in the respective groups is greater than a predetermined threshold in order for the write data DATA to have zeros ('0's) as many as possible. For example, when the number of '1's in the respective groups is, for example, 65 or more, whole bit of the corresponding group may be inverted and the index INDEX corresponding to the inverted group may be generated to have a value of '1'. Otherwise, the corresponding group may be non-inverted and the index INDEX corresponding to the non-inverted group may be generated to have a value of '0'.

For example, the index INDEX having a value of '0000' may represent the write data DATA with non-inversion of the host write data HOST_DATA, which means that the host write data HOST_DATA may be the same as the write data DATA. The index INDEX having a value of '1111' may represent the write data DATA with inversion of all bits of the host write data HOST_DATA. The index INDEX having a value of '1100' may represent the write data DATA with inversion of a first half bits of the host write data HOST_DATA and non-inversion of a second half bits of the host write data HOST_DATA. As such, even when the host write data HOST_DATA is modified into the write data DATA having different value, the modification is made on the basis of the index INDEX indicating inversion and non-inversion of the host write data HOST_DATA and thus the host write data HOST_DATA can be restored from the write data DATA based on the index INDEX.

A data pattern of the write data DATA may be simpler than that of the host write data HOST_DATA.

The error correction circuit 312 may generate an error correction code ECC based on the write data DATA and the index INDEX. The number of bits of the error correction code ECC may be adjusted so that total size of the write data DATA, the index INDEX and the error correction code ECC is smaller than a unit size (e.g., 576 bits) of data to be stored in the memory module 120 at one time.

During the write operation, the write data DATA and the index INDEX input to the error correction circuit 312, and, the write data DATA' and the index INDEX', which are ECC-encoded and output from the error correction circuit 312, may be the same as each other, respectively. When the total size of the ECC-encoded write data DATA', the ECC-encoded index INDEX' and the error correction code is smaller than the unit size (e.g., 576 bits) of data to be stored in the memory module 120 at one time, remaining bits in the unit size (e.g., 576 bits) may have a value of zero (0) (i.e., they may be zero-padded).

The ECC-encoded write data DATA', the ECC-encoded index INDEX' and the error correction code ECC may be transmitted to and stored in the memory devices 121 to 129 of the memory module 120.

The Read Operation

During the read operation, the read data DATA', the index INDEX' and the error correction code may be read from the memory devices 121 to 129 of the memory module 120 and transmitted to the error correction circuit 312 of the memory controller 310. The error correction circuit 312 may correct the errors of the read data DATA' and the index INDEX' by using the error correction code ECC, and generate an ECC-decoded read data DATA and an ECC-decoded index INDEX. When there is no error in the read data DATA' and the index INDEX', the read data DATA' and the index INDEX' may be the same as the ECC-decoded read data DATA and the ECC-decoded index INDEX, respectively.

The data inversion circuit 311 may restore the host read data HOST_DATA by inverting or noninverting the ECC-decoded read data DATA based on the ECC-decoded index INDEX. For example, when the ECC-decoded index INDEX has a value of '0000', the host read data HOST_DATA may be restored to be the same as the read data DATA. When the index INDEX has a value of '0011', the host read data HOST_DATA may be restored by non-inverting a first half of the read data DATA and inverting a second half of the read data DATA.

The restored host read data HOST_DATA may be transferred from the data modification unit 311 to the host.

In the memory system 300 of FIG. 3, although the index INDEX is further added to the host data HOST_DATA as well as the error correction code, the host data HOST_DATA having a predetermined data pattern may be modified to the data DATA having simpler data pattern through the small-sized index INDEX by the data modification unit 311. The simpler data pattern may have zeros ('0's) as many as possible. The simpler data pattern may reduce current consumption during the write and read operations while improving the lifetime of the memory devices 121 to 129.

Although the embodiments of FIG. 3 determine the inversion or non-inversion of the host data HOST_DATA according to the predetermined threshold number of '1's included in the host data HOST_DATA in order for the write data DATA to have as many as possible zeros ('0's), the predetermined threshold number of '0's included in the host data HOST_DATA also may be applied to the embodiments of FIG. 3 in order for the write data DATA to have as many as possible ones ('1's).

Figure 4:
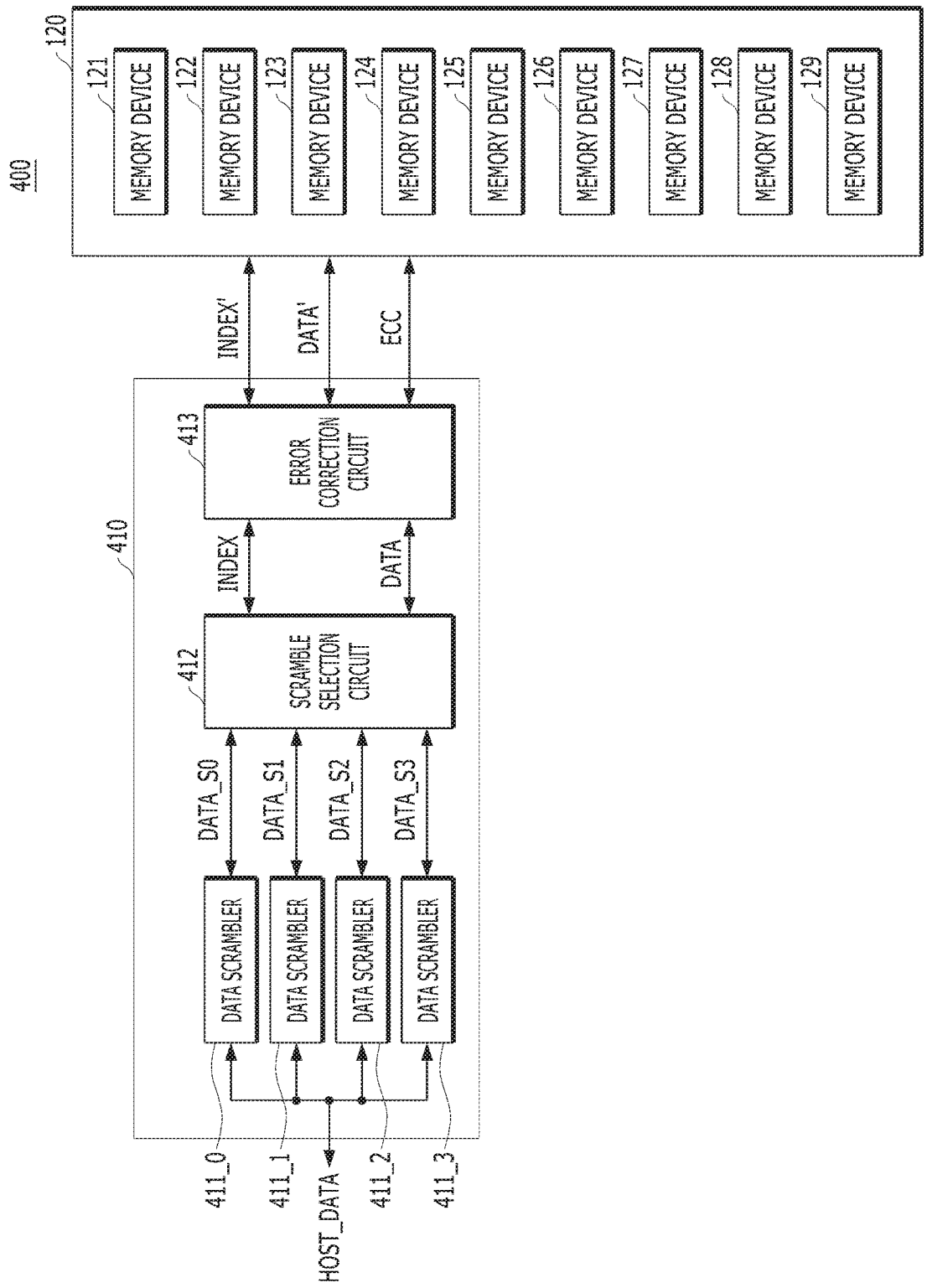
FIG. 4 is a block diagram of a memory system according to forth embodiments of the present disclosure.

FIG. 4 is a block diagram of a memory system 400 according to fourth embodiments of the present disclosure. FIG. 4 illustrates only a portion directly related to data transfer in the memory system 400.

Referring to FIG. 4, the memory system 400 may include a memory controller 410 and a memory module 120. The memory controller 410 may control the read and write operations of the memory module 120 in response to a request from the host.

The memory controller 410 may include a plurality of data scramblers 411_0 to 411_3, a scrambler selection circuit 412 and an error correction circuit 413. The data scramblers 411_0 to 411_3 may scramble the host write data HOST_DATA in different ways to generate scrambled data DATA_S0 to DATA_S3, respectively. A number of the data scramblers 411_0 to 411_3 may vary according to a system design. The scrambler selection circuit 412 may select one of the scrambled data DATA_S0 to DATA_S3 as the write data DATA, and may generate the index INDEX indicating one of the data scramblers 411_0 to 411_3 corresponding to the selected one among the scrambled data DATA_S0 to DATA_S3. A size of the index INDEX may depend on the number of the data scramblers 411_0 to 411_3. Some of the data scramblers 411_0 to 411_3, the scramble selection circuit 412 and the error correction circuit 413 may be disposed outside the controller 310 according to a system design.

The flow of data in the memory system 400 during the write operation and the read operation will now be described. Here, it is assumed that a size of data to be written and read during the respective write and read operations is 512 bits. That is, it is assumed that a size of the host data HOST_DATA is 512 bits. However, the embodiments are not limited in this manner and more or less bits may be used.

The Write Operation

During the write operation, the plurality of data scramblers 411_0 to 411_3 may generate the scrambled data DATA_S0 to DATA_S3 by scrambling the host write data HOST_DATA in different ways, respectively. Since the data scramblers 411_0 through 411_3 use different scrambling schemes, the scrambled data DATA_S0 to DATA_S3 may have different values.

The scramble selection circuit 412 may select as the write data DATA one among the scrambled data DATA_S0 to DATA_S3 according to a predetermined criterion, and generate index INDEX indicating one among the data scramblers 411_0 to 411_3 corresponding to the selected scrambled data, that is, a selected data scrambler.

In this case, the predetermined criterion may include reduced amounts of current consumptions of the respective memory devices 121 to 129, extended amount of lifetimes of the respective memory devices 121 to 129, simplicity degree of data pattern input to the respective memory devices 121 to 129, and so forth.

For example, the scramble selection circuit 412 may select as the write data DATA a scrambled data having the greatest number of '0's among the scrambled data DATA_S0 to DATA_S3 in order to reduce the current consumption of the memory devices 121 to 129.

Table 2 below shows a correspondence relationship between the selected data scrambler and the index INDEX.

TABLE 2

| The selected data scrambler | INDEX |
|---|---|
| 411_0 | 00 |
| 411_1 | 01 |
| 411_2 | 10 |
| 411_3 | 11 |

The error correction circuit 413 may generate an error correction code for both of the write data DATA and the index INDEX. The number of bits of the error correction code may be adjusted so that total size of the write data DATA, the index INDEX and the error correction code is smaller than a unit size (e.g., 576 bits) of data to be stored in the memory module 120 at one time.

During the write operation, the write data DATA and the index INDEX input to the error correction circuit 413, and, a write data DATA' and an index INDEX', which are ECC-encoded and output from the error correction circuit 413, may be the same as each other, respectively. When the total size of the ECC-encoded write data DATA', the ECC-encoded index INDEX' and the error correction code ECC is smaller than the unit size (e.g., 576 bits) of data to be stored in the memory module 120 at one time, remaining bits in the unit size (e.g., 576 bits) may have a value of zero (0) (i.e., they may be zero-padded).

The ECC-encoded write data DATA', the ECC-encoded index INDEX' and the error correction code ECC may be transmitted to and stored in the memory devices 121 to 129 of the memory module 120.

The Read Operation

During the read operation, the read data DATA', the index INDEX' and the error correction code ECC may be read from the memory devices 121 to 129 of the memory module 120 and transmitted to the error correction circuit 413 of the memory controller 410. The error correction circuit 413 may correct the errors of the read data DATA' and the index INDEX' by using the error correction code ECC, and generate an ECC-decoded read data DATA and an ECC-decoded index INDEX. When there is no error in the read data DATA' and the index INDEX', the read data DATA' and the index INDEX' may be the same as the ECC-decoded read data DATA and the ECC-decoded index INDEX.

The scramble selection circuit 412 may select one among the data scramblers 411_0 to 411_3 according to the ECC-decoded index INDEX, which indicates the selected data scrambler, and transmit the ECC-decoded read data DATA to the selected data scramblers.

The selected data scrambler may descramble the ECC-decoded read data DATA to restore the host read data HOST_DATA. The restored host read data HOST_DATA may then be transmitted to the host.

In the memory system 400 of FIG. 4, although the index INDEX is further added to the host data HOST_DATA as well as the error correction code ECC, the host data HOST_DATA may be optimally scrambled to the data DATA having simpler data pattern by the plurality of data scramblers 411_0 to 411_3 and the scramble selection circuit 412. The scramble may be indicated by the small-sized index INDEX. Due to the simpler pattern of the scrambled data DATA than the original host data HOST_DATA, the amount of current required to write and read the data of the simpler pattern may be reduced.

Although various embodiments have been described for illustrative purposes, it will be apparent to those skilled in the art that various changes and modifications may be made without departing from the spirit and scope of the disclosure as defined in the following claims.

What is claimed is:

1. A memory system, comprising:
   an index generating circuit configured for generating an index indicating that a host data corresponds to none or which predetermined pattern from a plurality of predetermined patterns in response to the host data;
   a data modification circuit configured for modifying the host data into a modified data based on the index; and
   one or more memory devices configured for storing the modified data and the index;
   an error correction circuit configured for generating an error correction code (ECC) for the modified data and the index during a write operation,
   wherein the data modification circuit generates the modified data identical to the host data when the index indicates that the host data corresponds to none of the predetermined patterns from the plurality of predetermined patterns,
   wherein the data modification circuit generates the modified data having a specific value regardless of a value of the host data when the index indicates that the host data corresponds to one of the predetermined patterns from the plurality of the predetermined patterns, indicating that the modified data is meaningless and that the index represents the host data,
   wherein the memory devices further store the ECC,
   wherein the data modification circuit further restores the host data to be the same as the ECC-decoded data when the ECC-decoded index indicates that the host data corresponds to none of the predetermined patterns from the plurality of predetermined patterns, and
   wherein the data modification circuit further restores the host data based on the ECC-decoded index regardless of the ECC-decoded data when the ECC-decoded index indicates that the host data corresponds to one of the predetermined patterns from the plurality of predetermined patterns.

2. The memory system of claim 1,
   wherein the error correction circuit further ECC-decodes the modified data and index that are read from the memory devices using a corresponding error correction code that is read from the memory devices.

3. The memory system of claim 1,
   wherein the index generation circuit, the data modification circuit and the error correction circuit are included in a memory controller, and
   wherein the memory devices are included in a memory module.

4. The memory system of claim 1,
   wherein the index includes binary values, each binary value of the index corresponds to a respective predetermined bit pattern included in the predetermined pattern the host data corresponds to.

* * * * *